(12) United States Patent
Masuoka (10) Patent No.: US 7,190,009 B2
(45) Date of Patent: Mar. 13, 2007

(54) SEMICONDUCTOR DEVICE

(75) Inventor: Sadaaki Masuoka, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 65 days.

(21) Appl. No.: 11/242,859

(22) Filed: Oct. 5, 2005

(65) Prior Publication Data
US 2006/0076575 A1  Apr. 13, 2006

(30) Foreign Application Priority Data
Oct. 13, 2004  (JP) .............................. 2004-299245

(51) Int. Cl.
H01L 29/80 (2006.01)
H01L 31/112 (2006.01)

(52) U.S. Cl. .................. 257/270; 257/365; 257/393

(58) Field of Classification Search ............. 257/270, 257/365, 393, 127, 484
See application file for complete search history.

(56) References Cited

U.S. PATENT DOCUMENTS 6,747,294 B1 * 6/2004 Gupta et al. ............... 257/127

6,940,131 B2 * 9/2005 Baldwin et al. ............ 257/355

FOREIGN PATENT DOCUMENTS

JP  02-283062  11/1990
JP  07-058289  3/1995

* cited by examiner

Primary Examiner—Theresa T. Doan
(74) Attorney, Agent, or Firm—Young & Thompson (57) ABSTRACT

There is provided a semiconductor device in which the thresholds of gate electrodes in transistors can be adjusted together for each of regions having their own functions different from one another. The semiconductor device is provided with: a P-type Si substrate 109; a P-type annular well 181 provided in the element formation surface side of the P-type Si substrate 109; and a N-type annular well 183 provided inside the P-type annular well 181. Moreover, an SRAM-P-type well 185 and an SRAM-N-type well 189 are provided inside the N-type annular well 183. A deep N-type well 133 is provided nearer to the bottom side of the P-type Si substrate 109 than the SRAM-P-type well 185 and the SRAM-N-type well 189. A plurality of P-type wells 103 are provided outside the P-type annular well 181, and a N-type 101 is provided in such a way that the well 101 encloses the outside faces of the P-type wells 103.

5 Claims, 4 Drawing Sheets

SEMICONDUCTOR DEVICE

This application is based on Japanese Patent application NO. 2004-299245, the content of which is incorporated hereinto by reference.

FIELD OF THE INVENTION

The present invention relates to a semiconductor device.

DESCRIPTION OF THE RELATED ART

For electric power saving of a semiconductor device such as a processor, it is effective to change voltages in multisteps according to processing loads applied to a processor and the like. That is, it is effective to change the threshold of a gate electrode of a transistor by controlling voltages applied to a region in which the transistor is provided in a state in which the voltages (back biases) are applied to the region in which the transistor is provided in the semiconductor device.

Moreover, when a plurality of regions with different functions are provided in a semiconductor device such as a processor in some cases, a threshold for the gate electrode of a transistor has been required to be controlled for each of the above regions. Even in the above cases, it is also effective to change the threshold of a gate electrode of a transistor by controlling voltages applied to a specific region in which the transistor is provided in a state in which voltages (back biases) are applied to each of the regions in the semiconductor device.

A conventional semiconductor device which can apply back biases is disclosed, for example, in Japanese Laid-open patent publication No. 2-283062. According to this document, a well region of a reverse conductivity type is provided in a semiconductor substrate of one first conductivity type, a field effect transistor of one conductivity type is formed in the above well region of a reverse second conductivity type, and a field effect transistor of a reverse conductivity type is formed on the substrate. Moreover, there has been described a configuration in which a well region of a reverse conductivity type is provided in such a way that the surrounding of a region, in which a field effect transistor of a reverse conductivity type is formed, on the surface of a substrate is enclosed. That is, a sea-shaped N-type well is formed in a P-type substrate, and an island-shaped P-type region is formed in the above sea-shaped N-type well.

Japanese Laid-open patent publication No. 2-283062 discloses that interconnect between wells can be eliminated in the above configuration to realize a C-MOS IC with a smaller size and a higher density.

Figure 8:
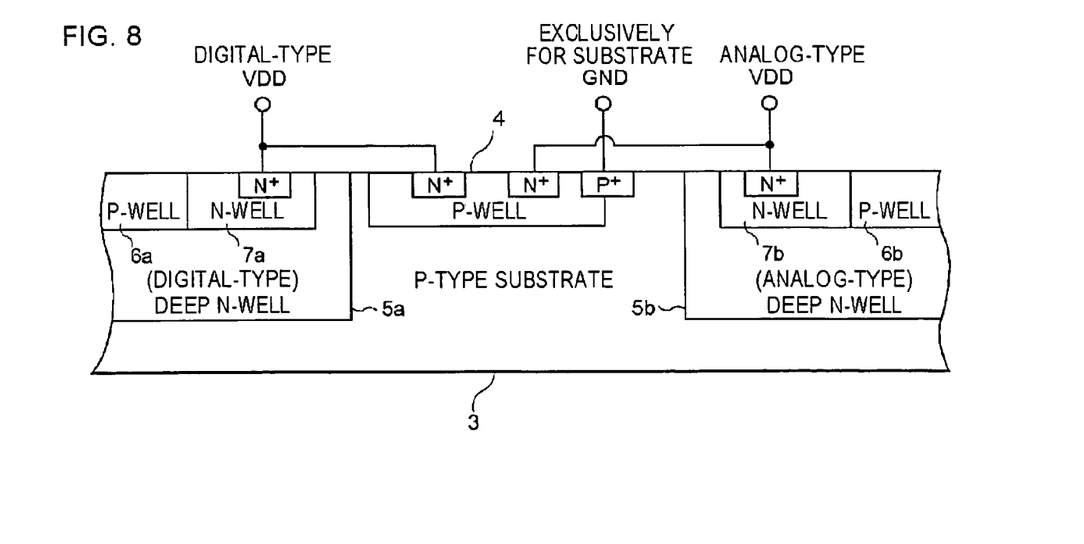
FIG. 8 is a longitudinal cross-sectional view explaining a configuration of a conventional and known semiconductor device.

Furthermore, another conventional semiconductor device is also disclosed in Japanese Laid-open patent publication No. 7-58289. FIG. 8 is a cross-sectional view showing a structure of this semiconductor device. There are formed two deep N-type wells 5a and 5b, in which N-type impurities are deeply diffused, in a semiconductor substrate 3. A P well 6a and a N well 7a are further formed in the deep N-type well 5a to form a digital circuit (not shown) of a CMOS. A digital power supply VDD is connected to the N well 7a through a high-concentrated impurity layer $N^+$. A P well 6b and a N well 7b are further formed in the deep N-type well 5b to form an analog circuit (not shown) of a CMOS. An analog power supply VDD is connected to the N well 7b through the high-concentrated impurity layer $N^+$.

There are formed two N-type high-concentrated impurity regions $N^+$, and one P-type high-concentrated impurity region $P^+$ in a P well 4 formed in the surface of the P-type substrate 3 between a digital circuit region and an analog circuit region. One of the two impurity regions $N^+$ is connected to the digital power supply VDD, and the other is connected to the analog power supply VDD. The impurity region $P^+$ is connected to the earth power supply (not shown) through an earth terminal GND exclusively for the substrate, and the P well 4 becomes an earth region.

Japanese Laid-open patent publication No. 7-58289 discloses that, according to the above configuration, a region in which the digital circuit is formed and a region in which the analog circuit is formed are of a triple well structure including the deep N-type well, respectively, and the both circuits are electrically isolated through the above structures to control electrical mutual interference between the digital circuit and the analog circuit.

However, the conventional techniques disclosed in the above-described patent documents have had the following problems to be solved.

In the first place, it is difficult for the semiconductor device according to Japanese Laid-open patent publication No. 2-283062 to control the thresholds of the gate electrodes in the transistors together for each regions when there are provided a plurality of the regions (a core region, an SRAM region, an input-output region, and the like) which individually have their own functions. For example, when the back-bias potentials for a P-type well or a N type well are required to be controlled together for each of regions with different functions, increase in the element size will be caused because it is required to run interconnects among a plurality of semiconductor chips with different functions.

In the second place, it is difficult for the semiconductor device according to Japanese Laid-open patent publication No. 7-58289 to adjust the thresholds of the PMOS gate electrodes in a N-type well together because a plurality of island-shaped N-type wells are provided in a sea-shaped P-type substrate. For example, when the potentials of a plurality of N-type wells are required to be adjusted together, a layout for interconnects will be complex because metal interconnects are required to be run among a plurality of N-type wells in a separate manner. Accordingly, increase in the chip area can not be avoided.

SUMMARY OF THE INVENTION

According to a first aspect of the present invention, there is provided a semiconductor device comprising: a semiconductor substrate of one conductivity type; a first annular region of one conductivity type, which is formed in an element formation surface side of the semiconductor substrate, and has an annular shape in a plane approximately in parallel with the element formation surface; a second annular region of a reverse conductivity type, which is formed inside the first annular region in the element formation surface side of the semiconductor substrate, and has an annular shape in a plane approximately in parallel with the element formation surface; a first region of one conductivity type which is formed inside the second annular region in the element formation surface side of the semiconductor substrate; a first transistor provided on the first region; a second region of a reverse conductivity type which is formed inside the second annular region in the element formation surface side of the semiconductor substrate; a second transistor provided on the second region; a lower region of a reverse conductivity type, having a configuration in which the lower region is provided nearer to the bottom side of the semiconductor substrate than the first and the second regions, and the first region and the bottom side of the semiconductor substrate are separated from each other; a plurality of third regions of one conductivity type which are formed outside the second annular region in the element formation surface side of the semiconductor substrate, and are electrically connected to each other through the bottom side of the semiconductor substrate; a third transistor provided on the third region; a fourth region of a reverse conductivity type, having a configuration in which the fourth region is formed outside the second annular region in the element formation surface side of the semiconductor substrate, is separated from the second annular region and the lower region by the first annular region, and encloses each of the outside faces of the third regions; and a fourth transistor provided on the fourth region.

According to this configuration, the first region of one conductivity type is formed inside the second annular region of a reverse conductivity type, and the third region of one conductivity type is formed outside the second annular region of a reverse conductivity type. Moreover, the first region and the bottom side of the semiconductor substrate are separated from each other by the lower region of a reverse conductivity type. Thereby, the first region of one conductivity type and the third region of one conductivity type are separated from each other by the second annular region of a reverse conductivity type and the lower region of a reverse conductivity type. Accordingly, the back bias applied to the first region of one conductivity type and the back bias applied to the third region of one conductivity type can be independently controlled, respectively.

Moreover, according to this configuration, there is provided the first annular region of one conductivity type by which the second annular region of a reverse conductivity type and the lower region of a reverse conductivity type are separated from the fourth annular region of a reverse conductivity type. Thereby, even when the second annular region of a reverse conductivity type, or the lower region of a reverse conductivity type is electrically connected to the second region of a reverse conductivity type, the second region of a reverse conductivity type is separated from the fourth region of a reverse conductivity type by the first annular region of one conductivity type. Accordingly, the back bias applied to the second region of a reverse conductivity type and the back bias applied to the fourth region of a reverse conductivity type can be independently controlled, respectively.

Moreover, according to this configuration, the bottoms of a plurality of the third regions of one conductivity type which are formed in an island shape in a state in which the third regions are enclosed in the element formation surface side of the semiconductor substrate, by the sea-shaped fourth region of a reverse conductivity type are connected to one another through the bottom side of the semiconductor substrate. Thereby, the potentials of the third region is adjusted to the same potential through the bottom side of the semiconductor substrate. Moreover, the potential of the whole fourth region is adjusted to the same potential because the fourth region is provided in a sea shape. Accordingly, the thresholds of the gate electrodes of the transistors existing on a plurality of regions of one conductivity type can be controlled together, and the thresholds of the gate electrodes of the transistor existing on a plurality of regions of a reverse conductivity type can be controlled together.

Thereby, the thresholds for the gate electrodes of the first transistor, the second transistor, the third transistor, and the fourth transistor can be independently controlled according to the above configuration, respectively. Accordingly, a semiconductor device by which the thresholds of the gate electrodes of the transistors can be adjusted together for each of regions with different functions can be obtained according to the above configuration.

Here, the bottom side of a semiconductor substrate means a region of one conductivity type, which is located nearer to the side of the bottom of the semiconductor substrate than the first region and the second region, but does not mean an absolute position in a limited way in the present invention.

In this invention, "annular shape" may means a shape which has a function dividing an inside region and an outside region in a plan view, and providing electrical insulation between the both regions, but does not mean that the shape is limited to a circular-ring one.

According to the present invention, a semiconductor device by which the thresholds of the gate electrodes of transistors can be adjusted together for each of regions with different functions, based on the specific configuration according this invention.

The semiconductor device according to the present invention can have a configuration in which the above-described lower region covers the bottom of the first region, and is attached to the bottom of the second region and that of the second annular region.

According to the above configuration, the first region of one conductivity type and the bottom side of one conductivity type in the semiconductor substrate can be separated in a stable manner, based on the simple structure. Thereby, potential leak from the first region to the bottom side of the semiconductor substrate can be controlled in a stable manner. Moreover, the potential control unit applying a back bias to the second region can be extracted onto the second annular region because the lower region is attached to the bottom of the second region and that of the second annular region.

The semiconductor device according to the present invention can have a configuration in which the above-described fourth region encloses the side of the first annular region, and the above-described first annular region is attached to the bottom side of the semiconductor substrate.

According to this configuration, the fourth region can be separated from the second annular region and the lower region in a stable manner, based on the simple structure even when there is provided the sea-shaped fourth region and the island-shaped region enclosed by the first annular region. Thereby, potential leak from the fourth region to the second annular region and the lower region can be controlled in a stable manner.

The semiconductor device according to the present invention can have a configuration in which a plurality of the above-described second regions are provided, the above-described first region continuously encloses the outside faces of the plurality of the second regions, and the plurality of the second regions are electrically connected to one another through the lower region.

According to this configuration, the back biases applied to the plurality of the second regions can be controlled together because the plurality of the second regions are electrically connected to one another through the lower region. Moreover, the whole first region is adjusted to a same potential because the first region is provided in a sea-shape. Thereby, the thresholds of the gate electrodes of transistors existing on a plurality of regions of a reverse conductivity type can be controlled together, and the thresholds of the gate electrodes of transistors existing on a region of one conductivity type can be also controlled together.

The semiconductor device according to the present invention can have a configuration in which the semiconductor device further comprises: the first potential control unit which is electrically connected to the above-described first region; the second potential control unit which is electrically connected to the above-described second region; the third potential control unit which is electrically connected to the above-described third region; and the fourth potential control unit which is electrically connected to the above-described fourth region, wherein the first potential control unit, the second potential control unit, the third potential control unit, and the fourth potential control unit are separately controlled, respectively.

According to this configuration, a potential of the first region, that of the second region, that of the third region, and that of the fourth region can be independently controlled, separately, because the first potential control unit, the second potential control unit, the third potential control unit, the fourth potential control unit, are independently controlled, respectively. Thereby, the thresholds of the gate electrode of the first transistor, that of the second transistor, that of the third transistor, and that of the fourth transistor can be independently controlled.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments according to the present invention will be explained, with reference to drawings. Here, similar components to each other are denoted by the same reference numerals in all the drawings, and detailed description will not be appropriately described.

<Embodiment 1>

Figure 1A:
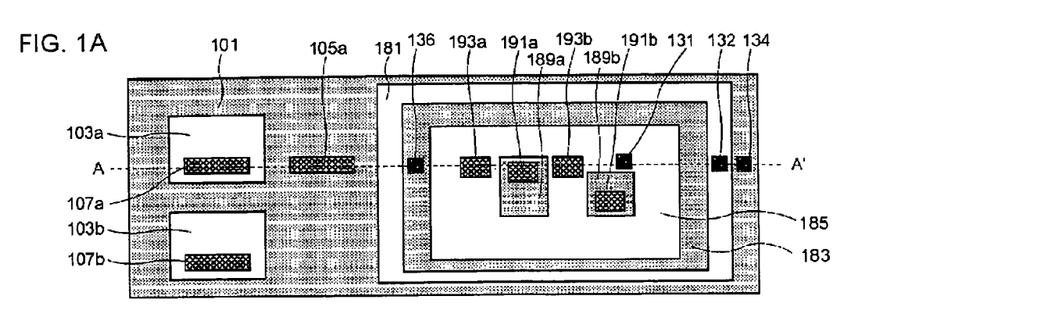
FIG. 1A is a plan view schematically showing an configuration of a semiconductor device according to an embodiment 1.
Figure 1B:
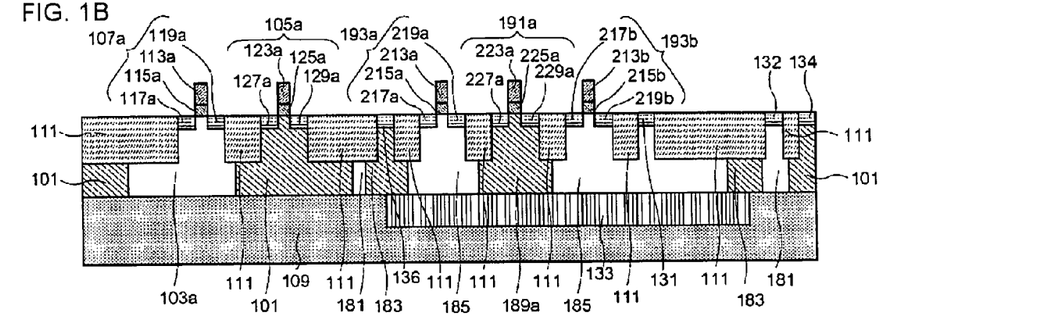
FIG. 1B is cross-sectional view schematically showing the configuration of the semiconductor device according to the embodiment 1.

FIG. 1A is a plan view schematically showing a configuration of a semiconductor device according to an embodiment 1, and FIG. 1B is a cross-sectional view schematically showing the configuration of the semiconductor device according to the present invention.

FIG. 1A is a plan view schematically showing the configuration of the semiconductor device according to this invention. The semiconductor device shown in the drawing comprises: a P-type Si substrate 109 (a semiconductor substrate of one conductivity type); and a P-type annular well 181 (a first annular region of one conductivity type), which is formed in the element formation surface side of the P-type Si substrate 109, and has an annular shape in a plane approximately in parallel with the element formation surface. Moreover, this semiconductor device is provided with a N-type annular well 183 (a reverse-conductivity-type annular region) inside the P-type annular well 181 in the element formation surface side of the P-type Si substrate 109. The N-type annular well 183 has an annular shape according to which the P-type annular well 181 and an after-described SRAM-P-type well 185 are divided. That is, "annular shape" means a shape which has a function dividing an inside region and an outside region in a plan view, and providing electrical insulation between the both regions. Here, element isolating regions 111 (STI) are formed in the element formation surface of the semiconductor device.

Moreover, the semiconductor device according to this embodiment is provided with the SRAM-P-type well 185 (first region of one-conductivity-type) formed inside the N-type annular well 183 in the element formation surface side of the P-type Si substrate 109. SRAM-NMOS transistors 193a and 193b (first transistors) are provided on the SRAM-P-type well 185. Moreover, SRAM-N-type wells 189a and 189b (second regions of a reverse conductivity type) are formed inside the N-type annular well 183. An SRAM-PMOS transistor 191a (a second transistor) is provided on the SRAM-N-type well 189a, and an SRAM-PMOS transistor 191b (a second transistor) is provided on the SRAM-N-type-well 189b. Here, a plurality of the SRAM-N-type well 189a and 189b are provided. Furthermore, the SRAM-P-type well 185 continuously encloses the outside faces of the SRAM-N-type wells 189a and 189b.

FIG. 1B is the longitudinal cross-sectional view, taken along the line A–A' of FIG. 1A, of the semiconductor device according to the present embodiment. The semiconductor device according to this embodiment is provided with a deep N-type well 133 (reverse-conductivity-type lower region) having a configuration in which the well 133 is provided nearer to the bottom side of the P-type Si substrates 109 than the SRAM-P-type well 185, and the SRAM-N-type wells 189a, and 189b, and the SRAM-P-type well 185 and the bottom side of the P-type Si substrate 109 are separated from each other. Here, the deep-N-type well 133 covers the bottom of the SRAM-P-type well 185, and is attached to the bottoms of the SRAM-N-type wells 189a and 189b and that of the N-type annular well 183. Moreover, the SRAM-N-type wells 189a and 189b are electrically connected to each other through the deep-N-type well 133.

Moreover, the semiconductor device according to this embodiment is provided with P-type wells 103a and 103b (third regions of one conductivity type) which are formed outside the N-type annular well 183 in the element formation surface side of the P-type Si substrate 109, and are electrically connected to each other through the bottom side of the P-type Si substrate 109. Furthermore, the semiconductor device according to this embodiment is provided with a core NMOS transistor 107*a* (a third transistor) provided on the P-type well 103*a*, and a core NMOS transistor 107*b* (a third transistor) provided on the P-type well 103*b*.

And, the semiconductor device according to this embodiment is provided with a N-type well 101 (a fourth region of a reverse conductivity type) having a configuration in which the well 101 is formed outside the P-type annular well 181 in the element formation surface side of the P-type Si substrate 109, and encloses the outside faces of the P-type wells 103*a* and 103*b*. Here, the N-type well 101 is separated from the N-type annular well 183 and the deep N-type well 133 by the P-type annular well 181. Moreover, the N-type well 101 is configured to enclose the side of the P-type annular well 181. Furthermore, the P-type annular well 181 is attached to the bottom side of the P-type Si substrate 109. In addition, the semiconductor device according to this embodiment is provided with a core PMOS transistor 105*a* (a fourth transistor) provided on the N-type well 101.

Moreover, the semiconductor device according to this embodiment is provided with an SRAM-P-type well contact 131 (a first potential control unit) which is electrically connected to the SRAM-P-type well 185. And, the semiconductor device according to this embodiment is provided with an SRAM-N-type well contact 136 (a second potential control unit) which is electrically connected to the SRAM-N-type wells 189*a* and 189*b*. Moreover, the semiconductor device according to this embodiment is provided with a P-type well contact 132 (a third potential control unit) which is electrically connected to the P-type wells 103*a* and 103*b*. Furthermore, the semiconductor device according to this embodiment is provided with a N-type well contact 134 (a fourth potential control unit) which is electrically connected to the N-type well 101. And, voltage applying units (not shown) are connected to each of the SRAM-P-type well contact 131, the SRAM-N-type well contact 136, the P-type well contact 132, and the N-type well contact 134, and the voltage applying units are separately controlled.

Hereinafter, operations of the semiconductor device according to the present embodiment will be explained.

A power supply (not shown) is provided outside the semiconductor device in this embodiment, and a power-supply voltage is assumed to be 1.0 volt. Here, four voltage controllers (not shown) are connected to the above power supply, and are separately controlled. The above power supply is connected to the P-type well contact 132, the N-type well contact 134, the SRAM-P-type well contact 131, and the SRAM-N-type well contact 136 through each of four voltage controller which can be independently controlled.

And, a desired voltage Vpw between zero volts through 2.0 to is applied to the P-type well contact 132, and a desired voltage Vpsw between zero volts to 2.0 volts is applied to the SRAM-P-type well contact 131. On the other hand, a desired voltage Vnw between 1.0 volts to 3.0 volts is individually applied to the N-type well contact 134, and a desired voltage Vsnw between 1.0 volts to 3.0 volts is individually applied to the SRAM-N-type well contact 136.

At this time, the voltage (Vpw) applied to the P-type well contact 132 is applied to the P-type well 103*a* through the P-type well 181 and the P-type Si substrate 109 to adjust the threshold of the gate electrode 113*a* in the core NMOS transistor 107*a*, and, similarly, to the P-type well 103*b* through the P-type well 181 and the P-type Si substrate 109 to adjust the threshold of the gate electrode (not shown) in the core NMOS transistor 107*b*. Similarly, the voltage (Vnw) applied to the N-type well contact 134 is applied to the N-type well 101 to adjust the threshold of the gate electrode 123*a* in the PMOS transistor 105*a*.

Similarly, the voltage (Vspw) applied to the SRAM-P-type well contact 131 is applied to the SRAM-P-type well 185 to adjust the threshold of the gate electrode 213*a* in the SRAM-NMOS transistor 193*a*, and to adjust the threshold of the gate electrode 213*b* in the SRAM-NMOS transistor 193*b*. Moreover, the voltage (Vsnw) applied to the SRAM-N-type well contact 136 is applied to the SRAM-N-type well 189*a* through the N-type annular well 183 and the N-type deep well 133 to adjust the threshold of the gate electrode 223*a* in the SRAM-PMOS transistor 191*a*, and, similarly, to the SRAM-N-type well 189*b* through the N-type annular well 183 and the N-type deep well 133 to adjust the threshold of the gate electrode (not shown) in the SRAM-PMOS transistor 191*b*.

Here in after, steps of manufacturing the semiconductor device according to the present embodiment will be explained. Here, the following manufacturing steps illustrate only one example, and steps, according to the present embodiment, of manufacturing a semiconductor device are not limited to the following manufacturing steps.

Figure 2A:
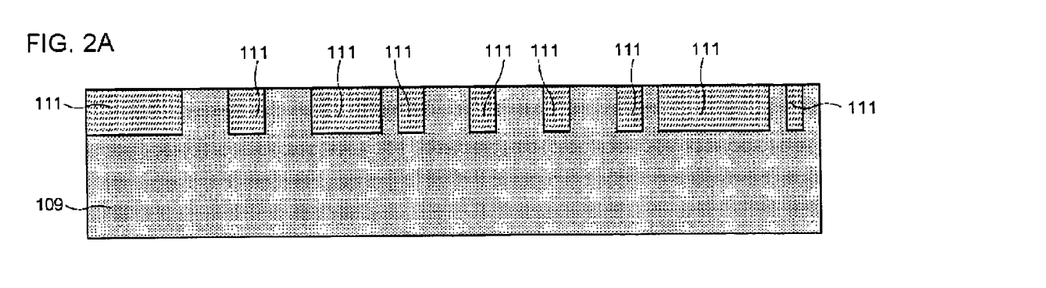
FIGS. 2A and 2B is a step cross-sectional view explaining a step for manufacturing the semiconductor device according to the embodiment 1.
Figure 2B:
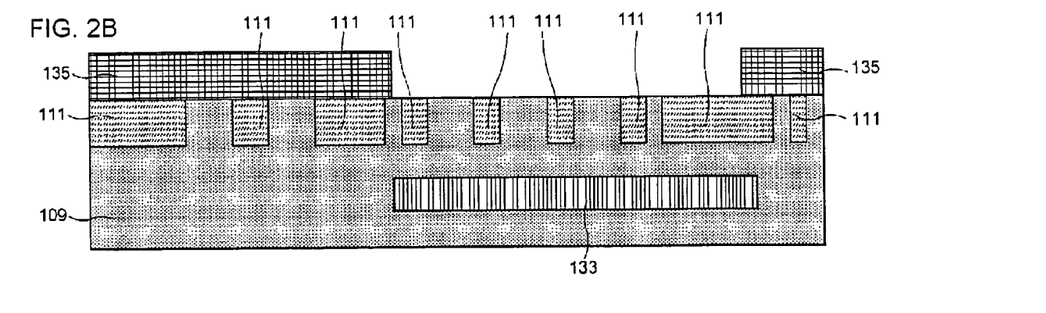

FIGS. 2A and 2B is a step cross-sectional view explaining a step of manufacturing the semiconductor device according to this embodiment.

In the first place, a predetermined number of the element isolating regions 111 are formed in the element formation surface side of the P-type Si substrate 109 by a well-known method as shown in FIG. 2A. The element isolating region 111 is formed as a shallow-trench element isolating region 111 (STI) by forming shallow grooves in predetermined regions of the element formation surface of the P-type Si substrate 109 using a mask (not shown), and burying an insulating material into the grooves or forming insulating films on inside surfaces of the grooves, and then filling one of various materials into the grooves.

Subsequently, the sea-shaped deep N-type well 133 is formed in a region at a predetermined depth from the element formation surface as shown in FIG. 2B by ion implantation of phosphorus under a condition of 1 MeV and $2 \times 10^{13}$ cm$^{-2}$, using a photoresist mask 135 obtained by applying and patterning a photoresist on the element formation surface of the P-type Si substrate 109. This deep N-type well 133 is formed under a region on which the SRAM-PMOS transistors 191*a* and 191*b*, the SRAM-NMOS transistors 193*a* and 193*b*, and the like in the after-described SRAM region are to be formed.

Figure 3A:
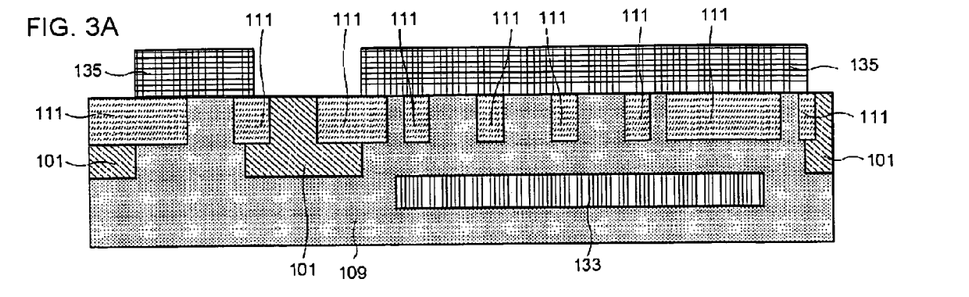
FIGS. 3A and 3B is a step cross-sectional view explaining a step of manufacturing the semiconductor device according to the embodiment 1.
Figure 3B:
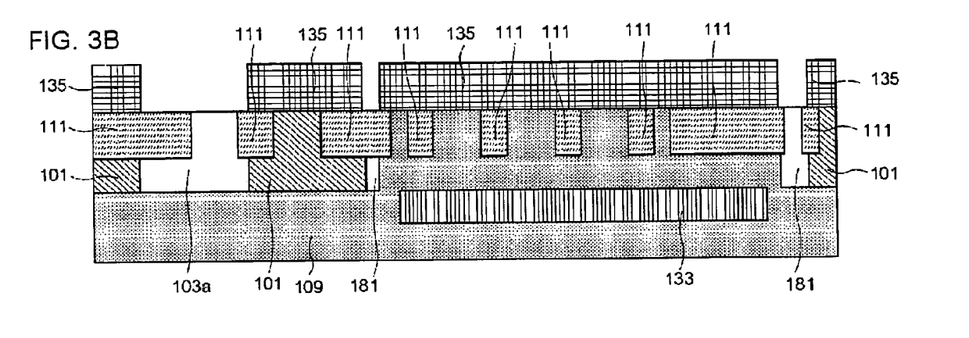

FIGS. 3A and 3B is a step cross-sectional view explaining a step of manufacturing the semiconductor device according to this embodiment.

Subsequently, the sea-shaped deep N-type well 101 is formed above the upper portion of the N type well 133 as shown in FIG. 3C by removing the photoresist mask 135, and by ion implantation of phosphorus under a condition of for example, 450 keV and $2 \times 10^{13}$ cm$^{-2}$, using a photoresist mask 135 obtained by applying and patterning a photoresist on the element formation surface of the P-type Si substrate 109. This N-type well 101 is not only formed underneath a region in which the core PMOS transistor 105*a* and the like in the after-described core region are to be formed, but is also formed in such a way that the well 101 spreads in a sea-shaped state. Here, the N-type well 101 is not formed in the after-described SRAM region at this point.

Then, the P-type wells 103a and 103b, and the P-type well 181 are formed as shown in FIG. 3D by removing the photoresist mask 135, and by ion implantation of boron under a condition of for example, 180 keV and $3\times10^{13}$ cm$^{-2}$, using a photoresist mask 135 obtained by applying and patterning a photoresist on the element formation surface of the P-type Si substrate 109. Here, the P-type well 103a is formed underneath a region in which the NMOS transistor 107a, and the like are to be formed, and the P-type well 103b is formed underneath a region on which the NMOS transistor 107b, and the like are to be formed, wherein the regions are in the after-described core region. Moreover, the P-type annular well 181 is formed in such a way that the well 181 encloses a region just on the deep N-type well 133.

Figure 4A:
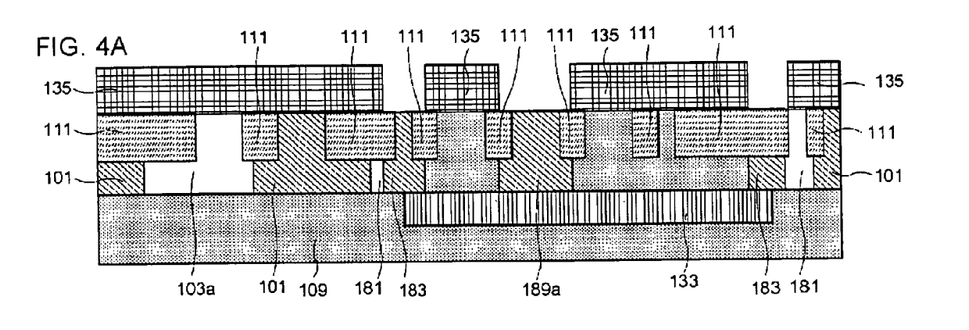
FIGS. 4A and 4B is a step cross-sectional view explaining a step of manufacturing the semiconductor device according to the embodiment 1.
Figure 4B:
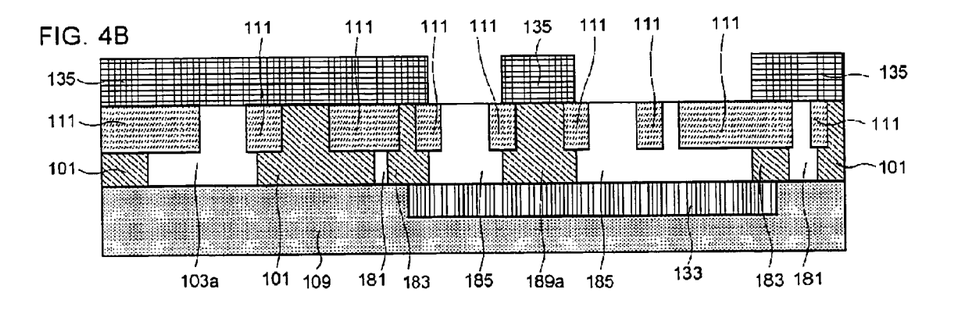

FIG. 4A and FIG. 4B are a step cross-sectional view explaining a step of manufacturing the semiconductor device according to this embodiment.

Subsequently, the N-type annular well 183, and the SRAM-N-type wells 189a and 189b are formed as shown in FIG. 4A by removing the photoresist mask 135, and by ion implantation of phosphorus under a condition of for example, 450 keV and $3\times10^{13}$ cm$^{-2}$, using a photoresist mask 135 obtained by applying and patterning a photoresist on the element formation surface of the P-type Si substrate 109, in such a way that the wells 183, 189a, and 189b are attached to the upper surface of the deep N-type well 133. Moreover, the RAM-N-type wells 189a and 189b are formed inside the N-type annular well 183. Here, the SRAM-N-type well 189a is formed underneath a region on which the SRAM-PMOS transistor 191a, and the like are to be formed, and the SRAM-N-type well 189b is formed underneath a region on which the SRAM-PMOS transistor 191b, and the like are to be formed, wherein the regions are in the after-described SRAM region.

Then, the SRAM-P-type well 185 is formed as shown in FIG. 4B by removing the photoresist mask 135, and by ion implantation of boron under a condition of for example 180 keV and $3\times10^{13}$ cm$^{-2}$, using a photoresist mask 135 obtained by applying and patterning a photoresist on the element formation surface of the P-type Si substrate 109. Here, the SRAM-P-type well 185 is formed inside the N-type annular well 183. Moreover, the SRAM-type well 185 is formed underneath a region on which the SRAM-NMOS transistors 193a and 193b, and the like in the after-described SRAM region are to be formed.

Figure 5A:
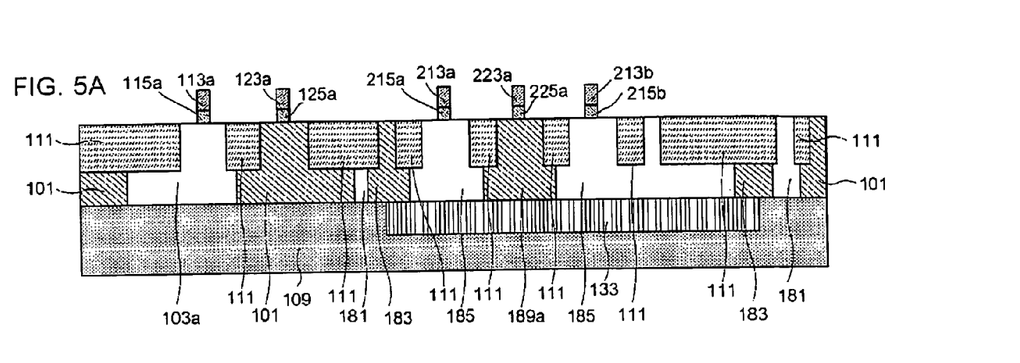
FIGS. 5A and 5B is a step cross-sectional view explaining a step of manufacturing the semiconductor device according to the embodiment 1.

Subsequently, the photoresist mask 135 is removed, and, by a well-known method, gate insulating layers 115a, 125a, 215a, 215b, and 225a (some of the layers are not shown), which are composed of a silicon oxide layer, are formed, as shown in FIG. 5A, on the element formation surface in a region in which the core NMOS transistors 107a and 107b, the core PMOS transistor 105a, the SRAM-NMOS transistors 193a and 193b, and the SRAM-PMOS formation transistors 191a and 191b, which will be described later, are formed.

Then, the gate electrodes 113a, 123a, 213a, 213b, and 223a (some of the electrodes are not shown), which are composed of a polysilicon layer, are formed (the side wall is not shown) on the gate insulating layers 115a, 125a, 215a, 215b, and 225a (some of the layers are not shown). Specifically, a multi-layered film of the silicon oxide layer and the polysilicon layer is formed on the element formation surface of the P-type Si substrate 109, and the gate insulating layers 115a, 125a, 215a, 215b, and 225a (some of the layers are not shown), and the gate electrodes 113a, 123a, 213a, 213b, and 223a (some of the electrodes are not shown) are formed by selective etching and patterning, using photoresist masks (not shown) of the multi-layered film.

Figure 5B:
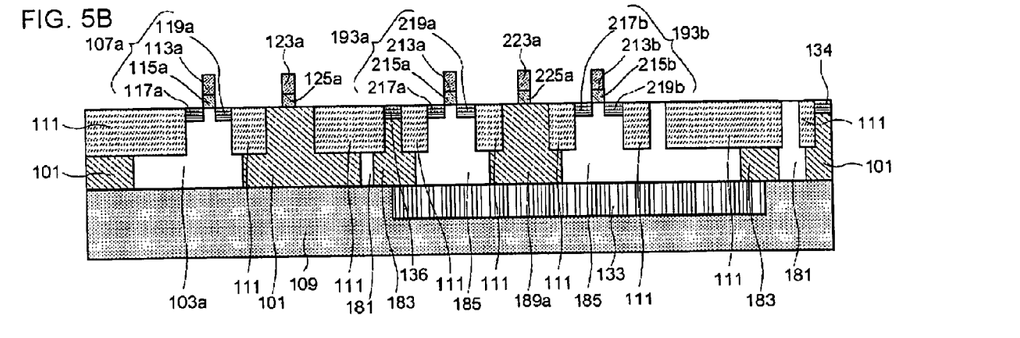

Subsequently, n$^+$ diffusion regions 117a and 119a, which function as a source electrode or a drain electrode of the core NMOS transistor 107a; n$^+$ diffusion regions (not shown), which function as a source electrode or a drain electrode of the core NMOS transistor 107b; n$^+$ diffusion regions 217a and 219a which function as a source electrode or a drain electrode of the SRAM-NMOS transistor 193a; and n$^+$ diffusion regions 217b and 219b which function as a source electrode or a drain electrode of the SRAM-NMOS transistor 193b are formed as shown in FIG. 5B by ion implantation of arsenic (As) into the P-type wells 103a, 103b, 185 under a condition of for example 30 keV and $5\times10^{15}$ cm$^{-2}$ in a state in which a region (a region in which the N-type well 101 is formed) in which the core PMOS transistor 105a is to be formed; a region (a region in which the SRAM-N-type well 189a is formed) in which the SRAM-PMOS transistor 191a is to be formed; and a region (a region in which the SRAM-N-type well 189b is formed) in which the SRAM-PMOS transistor 191b is to be formed are covered with a photoresist mask (not shown). Here, in this case, the N-type well contact 134 is formed on the N-type well 101, and the SRAM-N-type well contact 136 is formed on the N-type annular well 183.

Figure 6:
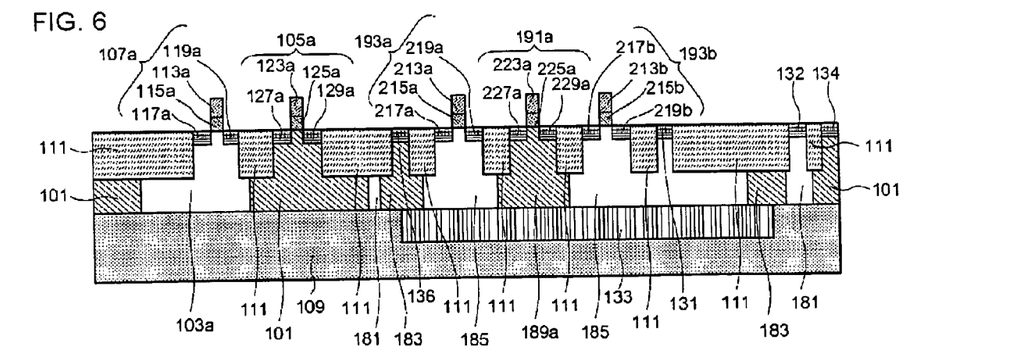
FIG. 6 is a cross-sectional view explaining a step of manufacturing the semiconductor device according to the embodiment 1.

FIG. 6 is a cross-sectional view explaining a step for manufacturing the semiconductor device according to this embodiment.

Then, p$^+$ diffusion regions 127a and 129a, which function as a source electrode or a drain electrode of the core PMOS transistor 105a; p$^+$ diffusion regions 227a and 229a which function as a source electrode or a drain electrode of the SRAM-PMOS transistor 191a and p$^+$ diffusion regions (not shown) which function as a source electrode or a drain electrode of the SRAM-PMOS transistor 191b (not shown) are formed as shown in FIG. 6 by ion implantation of boron (B) into the N-type well 101 and the SRAM-N-type wells 189a and 189b under a condition of 2 keV and $5\times10^{15}$ cm$^{-2}$ in a state in which a region (a region in which the P-type well 103a is formed) in which the core NMOS transistor 107a is to be formed; a region (a region in which the P-type well 103b is formed) in which the core NMOS transistor 107b is to be formed; a region (a region in which the SRAM-P-type well (not shown) is formed) in which the SRAM-NMOS transistor 193a is to be formed; and a region (a region in which the SRAM-P-type well (not shown) is formed) in which the SRAM-NMOS transistor 193b is to be formed; are covered with a photoresist mask (not shown). Here, in this case, the SRAM-P-type well contact 131 is formed on the SRAM-P-type well 185, and the P-type well contact 132 is formed on the P-type annular well 181.

Hereinafter, advantages of the semiconductor device according to the present embodiment will be explained.

Based on the semiconductor device according to the embodiment, a semiconductor device in which the thresholds of the gate electrodes in the transistors can be adjusted together for each of the N-type wells and the P-type wells included in the core regions and the SRAM regions, which individually have their own functions, can be obtained. Hereinafter, the reason will be described in detail.

According to the above semiconductor device, the N-type annular well 183 and the deep N-type well 133 are provided to separate the SRAM-P-type well 185 from the bottom side of the P-type Si substrate 109. Thereby, the SRAM-P-type well 185 and the P-type wells 103a and 103b which are electrically connected to each other through the bottom side of the P-type Si substrate 109 are separated from each other by the N-type annular well 183 and the deep N-type well 133. Accordingly, aback bias applied to the SRAM-P-type well 185 and that to the region of the P-type wells 103a and 103b can be independently controlled from one another.

Moreover, the P-type annular well 181 separating the N-type annular well 183 and the deep N-type well 133 from the N type well 101 is provided according to this semiconductor device. Thereby, the SRAM-N-type wells 189a and 189b are separated from the N-type well 101 through the P-type annular well 181 when the N-type annular well 183 or the deep N-type well 133 is electrically connected to the SRAM-N-type wells 189a and 189b. Accordingly, a back bias applied to the SRAM-N-type wells 189a and 189b and that to the N-type well 101 can be independently controlled from one another.

Moreover, the bottoms of the P-type wells 103a and 103b, which are provided in an island shape under a state in which the wells 103a and 103b are enclosed by the N-type well 101 provided in a sea-shape outside the P-type annular well 181 in the element formation surface side of the semiconductor substrate, are connected to each other through the bottom side of the P-type Si substrate 109 according to the above configuration. Thereby, the potentials of the P-type wells 103a and 103b are adjusted to a same potential through the bottom side of the P-type Si substrate 109. Moreover, the whole N-type well 101 is adjusted to the same potential, because the N-type well 101 is provided in a sea shape. Thus, the thresholds of the gate electrodes for the core NMOS transistor 107a existing on the P-type well 103a, and the core NMOS transistor 107b existing on the P-type well 103b can be adjusted together, and the core PMOS transistor 105a existing on the N-type well 101 can be separately adjusted.

Moreover, the bottoms of the SRAM-N-type wells 189a and 189b, which are provided in an island shape under a state in which the wells 189a and 189b are enclosed by the SRAM-P-type well 185 provided in a sea-shape inside the N-type annular well 183 in the element formation surface side of the semiconductor substrate, are connected to each other through the deep N-type well 133 according to the above configuration. Thereby, the potentials of the SRAM-N-type wells 189a and 189b are adjusted to a same potential through the deep N-type well 133. Moreover, the whole SRAM-P-type well 185 is adjusted to the same potential, because the SRAM-P-type well 185 is provided in a sea shape. Thus, the thresholds of the gate electrodes for the SRAM-NMOS transistors 193a and 193b existing on the SRAM-P-type well 185 can be adjusted together, and the SRAM-PMOS transistor 191a existing on the SRAM-N-type well 189a, and the SRAM-PMOS transistor 191b existing on the SRAM-N-type well 189b can be adjusted together.

Thereby, the thresholds of the gate electrodes can be controlled together in each of groups of the SRAM-NMOS transistors 193a and 193b, the SRAM-PMOS transistors 191a and 191b, and the core NMOS transistors 107a and 107b, and the thresholds of the gate electrodes can be separately controlled for each of the groups of the SRAM-NMOS transistors 193a and 193b, the SRAM-PMOS transistors 191a and 191b, the core NMOS transistors 107a and 107b, and the core PMOS transistor 105a. Accordingly, the thresholds of the gate electrodes in the transistors can be adjusted together for each of the N-type wells and the P-type wells included in the core regions and the SRAM regions according to this semiconductor device.

Moreover, a smaller-sized semiconductor device can be realized according to the present embodiment. That is, an interconnect connecting the P-type wells 103a and 103b can be eliminated because the potentials of a plurality of island-shaped P-type wells 103a and 103b are adjusted to a same potential through the bottom side of the P-type Si substrate 109. Moreover, an interconnect connecting the SRAM-N-type wells 189a and 189b can be eliminated because the potentials of the SRAM-N-type wells 189a and 189b are adjusted to a same potential through the deep N-type well 133.

Moreover, the voltage (Vpw) applied to the P-type well contact 132 is similarly applied to the P-type well 103a through the P-type well 181 and the P-type Si substrate 109. Furthermore, the voltage (Vsnw) applied to the SRAM-N-type well contact 136 is similarly applied to the SRAM-N-type wells 189a and 189b through the N-type annular well 183 and the N-type deep well 133.

Thereby, the P well contact and the N well contact can be extracted to a point away from transistors. Accordingly, the run length of interconnects outside the P-type Si substrate 109 can be reduced to realize a semiconductor device with a smaller size according to this embodiment.

<Embodiment 2>

Figure 7:
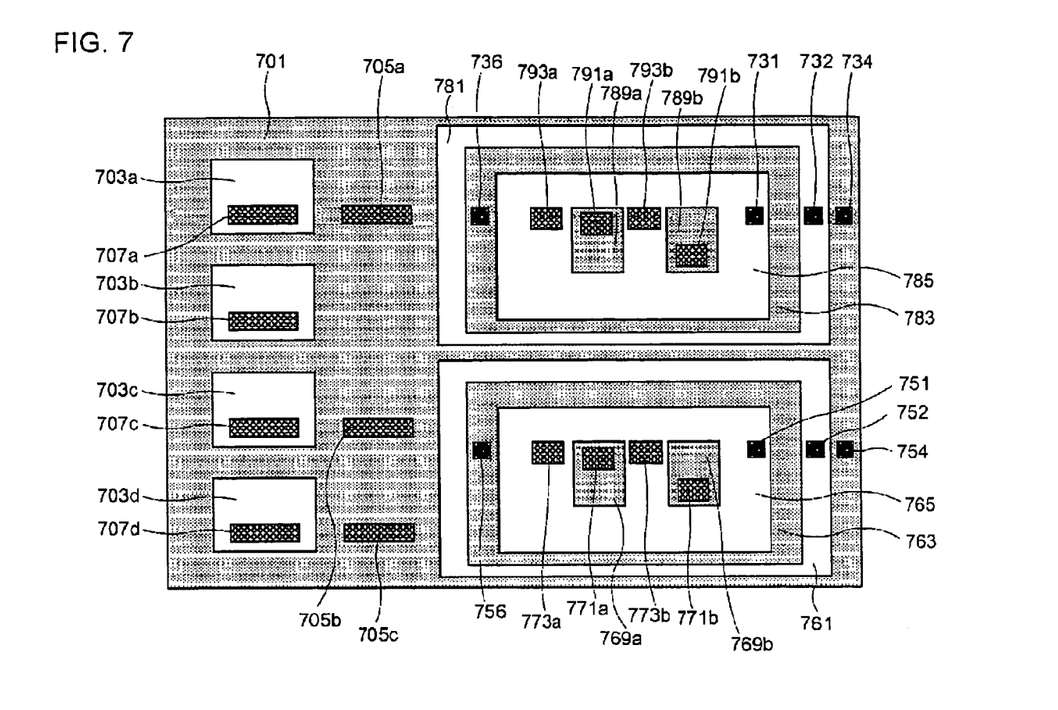
FIG. 7 is a plan view schematically showing a configuration of a semiconductor device according to an embodiment 2.

FIG. 7 is a plan view schematically showing a configuration of a semiconductor device according to an embodiment 2.

The configuration of the semiconductor device according to the present embodiment is basically similar to that of the semiconductor device according to the embodiment 1. Here, the configuration of this embodiment is different from that of the embodiment 1 in that an input-output region is provided in addition to the core regions and the SRAM regions. Moreover, the configuration of the input-output region is basically similar to that of the SRAM region.

The semiconductor device according to this embodiment is provided with: a P-type Si substrate (not shown); and an SRAM-P-type annular well 781, which is formed in the element formation surface side of the P-type Si substrate (not shown), and has an annular shape in a plane approximately in parallel with the element formation surface. Moreover, the semiconductor device according to this embodiment is provided with an SRAM-N-type annular well 783 which is formed inside the SRAM-N-type annular well 781 in the element formation surface side of the P-type Si substrate (not shown), and has an annular shape in a plane approximately in parallel with the element formation surface.

Furthermore, the semiconductor device in this embodiment is provided with an SRAM-N-type annular well 785 which is formed inside the SRAM-N-type annular well 783 in the element formation surface side of the P-type Si substrate (not shown). SRAM-NMOS transistors 793a and 793b is provided on the SRAM-P-type well 785. Moreover, the semiconductor device according to this embodiment is provided with SRAM-N-type wells 789a and 789b which is provided inside the SRAM-N-type annular well 783 in the element formation surface side of the P-type Si substrate (not shown). An SRAM-PMOS transistor 791a is provided on the SRAM-N-type well 789a, and an SRAM-PMOS transistor 791b is provided on the SRAM-N-type well 789b. Here, a plurality of SRAM-N-type wells 789a, and a plurality of SRAM-N-type wells 789b are provided. Furthermore, the SRAM-P-type well 785 continuously encloses the outside faces of the SRAM-N-type wells 789a and 789b.

Moreover, the semiconductor device according to this embodiment is provided with an input-output P-type annular well 761 which is formed in the element formation surface side of the P-type Si substrate (not shown), and has an annular shape in a plane approximately in parallel with the element formation surface. Furthermore, the semiconductor device according to this embodiment is provided with an input-output N-type annular well 763 which is formed inside the input-output P-type annular well 761 in the element formation surface side of the P-type Si substrate (not shown), and has an annular shape in a plane approximately in parallel with the element formation surface.

In addition, the semiconductor device according to this embodiment is provided with an input-output P-type well 765 formed inside the input-output N-type annular well 763 in the element formation surface side of the P-type Si substrate (not shown). Input-output-NMOS transistors 773a and 773b are provided on the input-output P-type well 765. Moreover, the semiconductor device according to this embodiment is provided with input-output N-type wells 769a and 769b inside the input-output N-type annular well 763 in the element formation surface side of the P-type Si substrate (not shown). An input-output-PMOS transistor 771a is provided on the input-output N-type well 769a, and an input-output-PMOS transistor 771b is provided on the input-output N-type well 769b. Here, a plurality of input-output-N type wells 769a and 769b are provided. Moreover, the input-output P-type well 765 continuously encloses the outside faces of the input-output-N type wells 769a and 769b.

Moreover, the semiconductor device according to this embodiment is provided with an SRAM-deep-N-type well (not shown) having a configuration in which the SRAM-deep N-type well is provided nearer to the bottom side of the P-type Si substrate (not shown) than the SRAM-P-type well 785, and the SRAM-N-type wells 789a and 789b, and the SRAM-P-type well 785 and the bottom side of the P-type Si substrate are separated from each other. Here, the SRAM-deep-N-type well (not shown) covers the bottom of the SRAM-P-type well 785, and is attached to the bottoms of the SRAM-N-type wells 789a and 789b, and that of the N-type annular well 783. Moreover, the SRAM-N-type wells 789a and 789b are electrically connected to each other through the SRAM-deep-N-type well (not shown).

Furthermore, the semiconductor device according to this embodiment is provided with an input-output deep N-type well (not shown) having a configuration in which the input-output deep N-type well is provided nearer to the bottom side of the P-type Si substrate (not shown) than the SRAM-P-type well 765, and the input-output N-type wells 769a and 769b, and the input-output P-type well 765 and the bottom side of the P-type Si substrate (not shown) are separated from each other. Here, the input-output deep N-type well (not shown) covers the bottom of the input-output P-type well 765, and is attached to the bottom of the well 765, that of those of the input-output N-type wells 769a and 769b, and that of the input-output N-type annular well 763. The input-output N-type wells 769a and 769b are electrically connected to each other through the input-output deep N-type well (not shown).

The semiconductor device according to this embodiment is provided with P-type wells 703a, 703b, 703c, and 703d which are formed outside the SRAM-P-type annular well 781 and the input-output P-type annular well 761 in the element formation surface side of the P-type Si substrate (not shown), and are electrically connected to one another through the bottom side of the P-type Si substrate (not shown). Moreover, the semiconductor device according to this embodiment is provided with a core NMOS transistor 707a provided on the P-type well 703a, a core NMOS transistor 707b provided on the P-type well 703b, a core NMOS transistor 707c provided on the P-type well 703c, and a core NMOS transistor 707d provided on the P-type well 703d.

And, the semiconductor device according to this embodiment is provided with a N-type well 701 having a configuration in which the well 701 is formed outside the P-type annular well 781 in the element formation surface side of the P-type Si substrate (not shown), and encloses the outside faces of the P-type wells 703a, 703b, 703c, and 703d. Here, the N type well 701, and the SRAM-N-type annular well 783 and the SRAM-deep-N-type well (not shown) are separated from one another through the SRAM-P-type annular well 781; and the N type well 701, and the input-output N-type annular well 763 and the input-output-deep-N-type well (not shown) are separated from one another through the input-output P-type annular well 761. Moreover, the N-type well 701 is configured to enclose the side face of the SRAM-P-type annular well 781 and that of the input-output P-type annular well 761. Furthermore, the SRAM-P-type annular well 781 and the input-output P-type annular well 761 are attached to the bottom side of the P-type Si substrate (not shown). Moreover, the semiconductor device according to this embodiment is provided with core PMOS transistors 705a, 705b, and 705c provided on the N-type well 701.

Furthermore, the semiconductor device according to this embodiment is provided with a SRAM-P-type well contact 731 which is electrically connected to the SRAM-P-type well 785. Moreover, the semiconductor device according to this embodiment is provided with an SRAM-N-type well contact 736 which is electrically connected to the SRAM-N-type wells 789a and 789b.

Furthermore, the semiconductor device according to this embodiment is provided with an input-output P-type well contact 751 which is electrically connected to the input-output P-type well 765. Moreover, the semiconductor device according to this embodiment is provided with an input-output N-type well contact 756 which is electrically connected to the input-output N-type wells 769a and 769b.

And, the semiconductor device according to this embodiment is provided with P-type well contacts 732 and 752 (or, either of a P-type well contact 732 or 752) which are electrically connected to the P-type wells 703a, 703b, 703c, and 703d. Moreover, the semiconductor device according to this embodiment is provided with N-type well contacts 734 and 754 (or, either of a N-type well contact 734 or 754) which are electrically connected to the N-type well 701.

And, voltage applying units (not shown) connected to each of the SRAM-P-type well contact 731, the SRAM-N-type well contact 736, the P-type well contacts 732 and 752, the N-type well contacts 734 and 754, the input-output P-type well contact 751, and the input-output N-type well contact 756 are separately controlled.

Hereinafter, advantages of the semiconductor device according to the present embodiment will be explained.

Even by the semiconductor device according to this embodiment, a semiconductor device in which the thresholds of the gate electrodes in the transistors can be adjusted together for each of the N-type wells and the P-type wells included in the core regions, the SRAM regions, and the input-output regions, which individually have their own functions, can be obtained in a similar manner to that of the semiconductor device according to the embodiment 1.

In addition to the above-described advantage, an advantage that a smaller semiconductor device can be realized is obtained by the semiconductor device according to this embodiment. That is, if either of the P-type well contact 732 or 752 is provided, the potentials of the P-type wells 703*a*, 703*b*, 703*c*, and 703*d* can be controlled together. Moreover, if either of the N-type well contact 734 or 754 is provided, the potential of the whole P-type well 701 can be controlled. Thereby, the run length of interconnects outside the P-type Si substrate can be reduced to realize a semiconductor device with a smaller size.

Another region with a different function, except the above-illustrated regions of the core regions, the SRAM regions, and the input-output regions, can be provided in the semiconductor device according to this embodiment. Even in this case, the potentials of the P-type wells and those of the N-type wells in each region in each region can be controlled together in a separate manner from one another; and the potentials for each region can be separately controlled, because any regions except the core regions are separated from the core regions, using the above-described double-well structure of the P-type annular well and the N-type annular well, and the deep N-type well.

The embodiments according to the present invention have been described above, referring to the drawings. But, the above embodiments are to be considered as illustrative and not restrictive, and the present invention can adopt various kinds of configurations, except those in the above embodiments.

It is apparent that the present invention is not limited to the above embodiment, that may be modified and changed without departing from the scope and spirit of the invention.

What is claimed is:

1. A semiconductor device comprising:
    a semiconductor substrate of a first conductivity type;
    a first annular region of the first conductivity type, which is formed in an element formation surface side of said semiconductor substrate, and has an annular shape in a plane approximately in parallel with said element formation surface;
    a second annular region of a second conductivity type, which is formed inside said first annular region in said element formation surface side of the semiconductor substrate, and has an annular shape in a plane approximately in parallel with said element formation surface;
    a first region of the first conductivity type which is formed inside said second annular region in said element formation surface side of said semiconductor substrate;
    a first transistor provided on said first region;
    a second region of the second conductivity type which is formed inside said second annular region in said element formation surface side of said semiconductor substrate;
    a second transistor provided on said second region;
    a lower region of the second conductivity type, having a configuration in which said lower region is provided nearer to the bottom side of said semiconductor substrate than said first and said second regions, and said first region and the bottom side of said semiconductor substrate are separated from each other;
    a plurality of third regions of the first conductivity type which are formed outside said second annular region in said element formation surface side of said semiconductor substrate, and are electrically connected to each other through the bottom side of said semiconductor substrate;
    a third transistor provided on said third region;
    a fourth region of the second conductivity type, having a configuration in which said fourth region is formed outside said second annular region in said element formation surface side of said semiconductor substrate, is separated from said second annular region and said lower region by said first annular region, and encloses each of the outside faces of said third regions; and
    a fourth transistor provided on said fourth region.

2. The semiconductor device according to claim 1, wherein said lower region covers the bottom of said first region, and is attached to the bottoms of said second region and said second annular region.

3. The semiconductor device according to claim 1, wherein said fourth region is configured to enclose the side of said first annular region, and
    said first annular region is attached to the bottom side of said semiconductor substrate.

4. The semiconductor device according to claim 1, wherein a plurality of said second regions are provided, said first region continuously encloses each of the outside faces of said second regions, and
    said plurality of second regions are electrically connected to each other through said lower region.

5. The semiconductor device according to claim 1, further comprising:
    a first potential control unit which is electrically connected to said first region;
    a second potential control unit which is electrically connected to said second region;
    a third potential control unit which is electrically connected to said third region; and
    a fourth potential control unit which is electrically connected to said fourth region,
    wherein said first potential control unit, said second potential control unit, said third potential control unit, and said fourth potential control unit are separately controlled.

* * * * *